United States Patent
Park

(10) Patent No.: US 9,269,426 B1
(45) Date of Patent: Feb. 23, 2016

(54) 3D VARIABLE RESISTANCE MEMORY DEVICE HAVING JUNCTION FET AND DRIVING METHOD THEREOF

(71) Applicant: SK hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/935,264

(22) Filed: Nov. 6, 2015

Related U.S. Application Data

(62) Division of application No. 13/949,529, filed on Jul. 24, 2013, now Pat. No. 9,214,225.

(30) Foreign Application Priority Data

Apr. 9, 2013 (KR) .................. 10-2013-0038587

(51) Int. Cl.
*G11C 11/00* (2006.01)
*G11C 13/00* (2006.01)

(52) U.S. Cl.
CPC .................. *G11C 13/0002* (2013.01)

(58) Field of Classification Search
CPC ....................................................... G11C 11/00
USPC ............. 365/46, 94, 100, 129, 148, 158, 163;
257/2–5, 9, 295, 310, E21.35; 438/95,
438/96, 135, 166, 240, 365, 482, 486, 597,
438/785
See application file for complete search history.

(56) References Cited

U.S. PATENT DOCUMENTS

| | | | |
|---|---|---|---|
| 2010/0265757 A1* | 10/2010 | Otsuka ............... | G11C 13/0009 365/148 |
| 2011/0063889 A1* | 3/2011 | Fukano .................. | G11C 5/025 365/148 |
| 2011/0075469 A1* | 3/2011 | Wei ..................... | G11C 11/5685 365/148 |
| 2011/0103133 A1* | 5/2011 | Okada ................... | H01L 27/101 365/148 |
| 2011/0122676 A1* | 5/2011 | Murooka ............... | G11C 5/063 365/148 |
| 2012/0008367 A1* | 1/2012 | Kajiyama ............. | H01L 27/228 365/148 |
| 2012/0087171 A1* | 4/2012 | Lee ........................ | H01L 45/04 365/148 |

* cited by examiner

*Primary Examiner* — Harry W Byrne
(74) *Attorney, Agent, or Firm* — IP & T Group LLP

(57) ABSTRACT

A 3D variable resistance memory device having a junction FET and a driving method thereof are provided. The variable resistance memory device includes a semiconductor substrate and a string selection switch formed on the semiconductor substrate. A channel layer is formed on the column string selection switch. A plurality of gates stacked along a length of the channel layer and each of the gates contacts an outer side of the channel layer. A variable resistance layer is formed on an inner side of the channel layer, and contacts the channel layer.

1 Claim, 6 Drawing Sheets

3D VARIABLE RESISTANCE MEMORY DEVICE HAVING JUNCTION FET AND DRIVING METHOD THEREOF

CROSS-REFERENCES TO RELATED APPLICATION

This application is a division of U.S. patent application Ser. No. 13/949,529 filed on Jul. 24, 2013, which claims priority under 35 U.S.C. 119(a) to Korean application number 10-2013-0038587, filed on Apr. 9, 2013, in the Korean Patent Offices. The disclosure of each of the foregoing applications is incorporated by reference in its entirety.

BACKGROUND OF THE INVENTION

1. Technical Field

The inventive concept relates to a semiconductor integrated circuit device, and more particularly, to a three-dimensional (3D) variable resistance memory device having a junction FET, and a driving method thereof.

2. Related Art

With the rapid development of mobile and digital information communication and consumer-electronic industry, studies on existing electronic charge controlled-devices are expected to encounter the limitation of the studies. Thus, new functional memory devices need to be developed. In particular, next-generation memory devices with large capacity, ultra-high speed, and ultra-low power need to be developed.

Currently, resistive memory devices using a resistance device as a memory medium have been suggested as the next-generation memory devices. Typically, phase-change random access memories (PCRAMs), resistance RAMs (ReRAMs), and magentoresistive RAMs (MRAMs) are used as the resistive memory devices.

The resistive memory devices may be basically configured of a switching device and a resistance device and store data "0" or "1" according to a state of the resistance device.

Even in the resistive memory devices, the first priority is to improve integration density and to integrate memory cells in a narrow area as many as possible. Further, when a plurality of memory cells are integrated in a limited region, switching performance has to be ensured.

SUMMARY

One or more exemplary implementations are provided to a 3D variable resistance memory device capable of improving integration density and ensuring switching performance, and a driving method thereof.

An exemplary variable resistance memory device may include a semiconductor substrate; a string selection switch formed on the semiconductor substrate; a channel layer formed on the column string selection switch; a plurality of gates stacked along a length of the channel layer, wherein each of the gates contacts an outer side of the channel layer; and a variable resistance layer formed on an inner side of the channel layer, wherein the variable resistance layer contacts the channel layer.

An exemplary variable resistance memory device may include a common source line; a plurality of strings of memory cells electrically connected, in series, to the common source line; a bit line electrically connected to the plurality of strings of memory cells; and a plurality of column string selection switches, each electrically connected to a corresponding one of the plurality of strings of memory cells, wherein each of the memory cells includes a variable resistance layer, and a junction transistor configured to selectively provide current to the variable resistance layer.

A method of driving an exemplary variable resistance memory device, in which a plurality of memory cells are stacked, and each of the plurality of memory cell includes a junction transistor and a variable resistor connected in parallel to the junction transistor, the method comprising turning off a junction transistor of a selected one of the plurality of stacked memory cells; and turning on junction transistors of non-selected memory cells of the plurality of stacked memory cells to form a current path in a variable resistance layer of the selected memory cell.

These and other features, aspects, and implementations are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
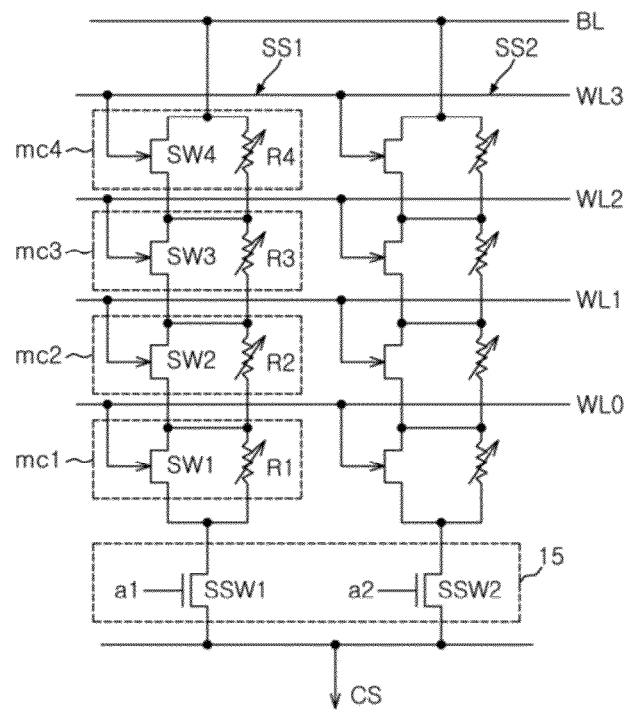
FIG. 1 is a circuit diagram illustrating an exemplary variable resistance memory device.

Hereinafter, exemplary implementations will be described in greater detail with reference to the accompanying drawings.

Exemplary implementations are described herein with reference to cross-sectional illustrations that are schematic illustrations of exemplary implementations (and intermediate structures). As such, variations from the shapes of the illustrations as a result, for example, of manufacturing techniques and/or tolerances, are to be expected. Thus, exemplary implementations should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Referring to FIG. 1, a variable resistance memory device 10 includes a plurality of memory cells mc1, mc2, mc3, and mc4 connected in series.

The plurality of memory cells mc1, mc2, mc3, and mc4 connected in series may be connected between a bit line BL and a common source line CS. That is, the plurality of memory cells mc1, mc2, mc3, and mc4 connected in series may be implemented by sequentially stacking the memory cells mc1, mc2, mc3, and mc4 on a semiconductor substrate (not shown). In the exemplary implementation, the stacked memory cells mc1 to mc4 connected in series may be connected to one bit line BL, and may be referred to as a column string SS1 and SS2. A plurality of column strings SS1 and SS2 may be connected to one bit line BL.

Each of the plurality of memory cells mc1 to mc4 may include a switching device SW1 to SW4 and a variable resistor R1 to R4, and the switching device SW1 to SW4 and the variable resistor R1 to R4 constituting each memory cell mc1 to mc4 may be connected in parallel to each other.

As the switching devices SW1 to SW4, a junction field effect transistor (FET) may be used. The variable resistors R1 to R4 may include various materials, such as a PrCaMnO (PCMO, Afterward use abbreviation.) layer for a ReRAM, a chalcogenide layer for a PCRAM, a magnetic layer for a MRAM, a magnetization reversal device layer for a spin-transfer torque magnetoresistive RAM (STTMRAM), or a polymer layer for a polymer RAM (PoRAM).

A column switch array 15 may be connected between the column strings SS1 and SS2 and the common source line CS. The column switch array 15 may include a plurality of string selection switches SSW1 and SSW2. The string selection switches SSW1 and SSW2 may be connected to the column strings SS1 and SS2 one by one, and each of the string selection switches SSW1 and SSW2 may selectively connect a corresponding column string SS1 or SS2 and the common source line CS in response to a corresponding selection signal a1 or a2.

Figure 2:
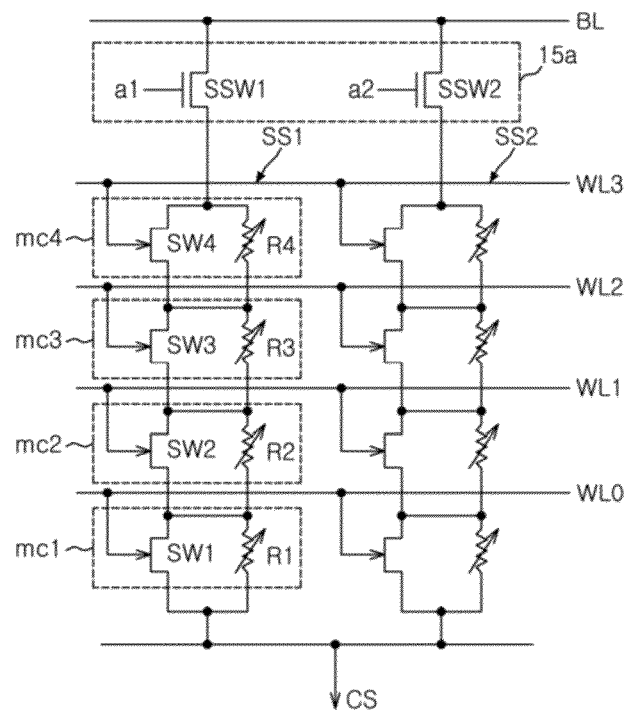
FIG. 2 is a circuit diagram illustrating an exemplary.

Alternatively, the column switch array 15 may be arranged between the column strings SS1 and SS2 and the bit line BL as illustrated in FIG. 2. The same effect as in the variable resistance memory device of FIG. 1 may be obtained.

A junction FET may be used as the switching devices SW1 to SW4 in an exemplary implementation. In the function FET, an area of a depletion layer is changed according to a gate bias, and a switching operation is performed.

Figure 3:
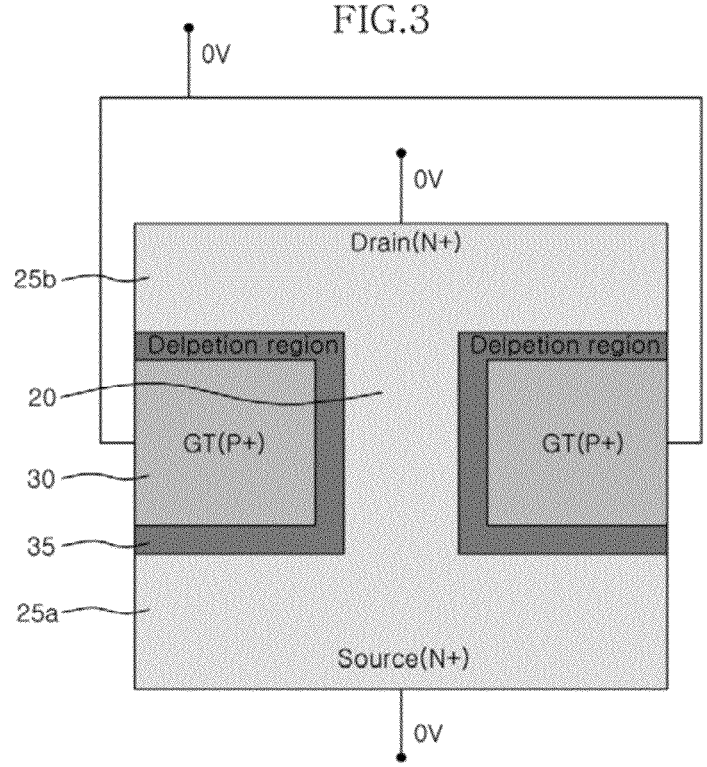
FIGS. 3 to 5 are cross-sectional views illustrating driving of an exemplary junction transistor.

Referring to FIG. 3, a source 25a and a drain 25b are formed in both ends of a channel layer 20. A gate 30 is formed around the channel layer 20 without a gate insulating layer interposed therebetween. The channel layer 20 may include an N-type impurity. The source 25a and the drain 25b may include a high concentration of the N-type impurity. The gate 30 may be a semiconductor layer including a high concentration of a P-type impurity. A depletion layer 35 may be formed between the gate 30 and the channel layer 20 and may form by a junction region between the gate 30 and the channel layer 20.

FIG. 3 shows a state in which no voltage is applied to the gate 30, the source 25a, and the drain 25b in the junction FET.

Figure 4:
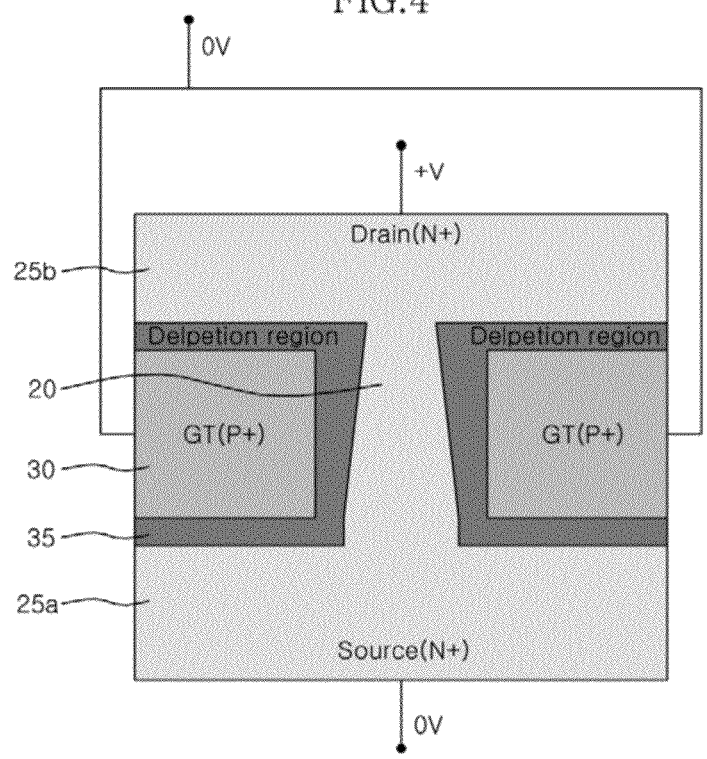

FIG. 4 shows a state in which the junction FET is turned on. In this state, a voltage +V is applied to the drain 25b and the depletion layer 35 is expanded to flow current in the channel layer 20.

Figure 5:
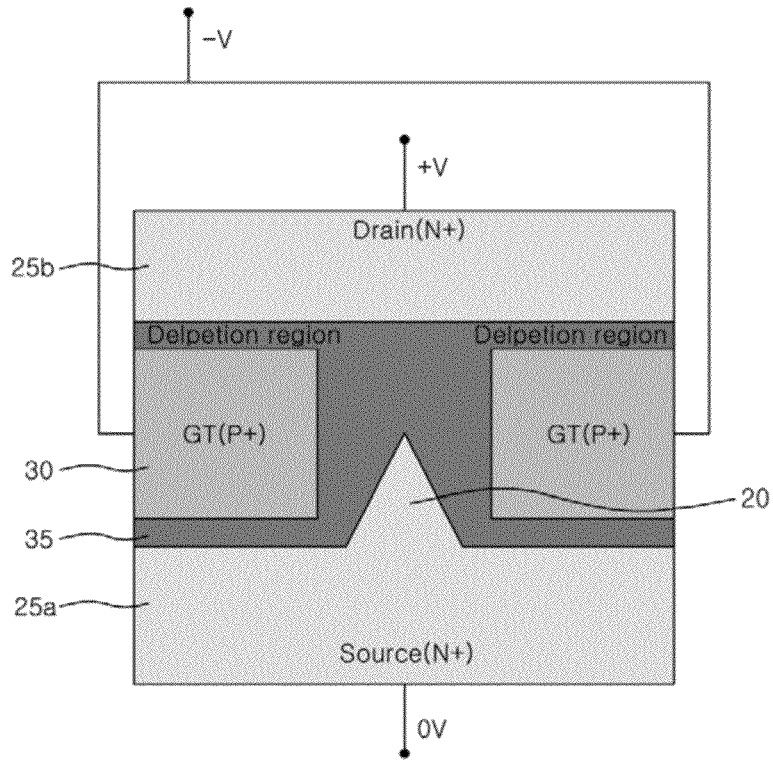

FIG. 5 shows a state in which 0 (zero) voltage is applied to the source 25a, and a positive voltage +V is applied to the drain 25b. If a reverse bias voltage −V is applied to the gate 30, then an area of the depletion layer 35 is increased and closes the channel layer 20. Therefore, the junction FET is turned off.

Thus, the junction FET used for the switching devices SW1 to SW4 may perform switching of the variable resistance memory device through control of the area of the depletion layer by the gate bias.

Hereinafter, the operation of the variable resistance memory device according to an exemplary implementation will be described.

In the exemplary implementation, a process of reading and writing data from and to a third memory cell mc3 of a first column string SS1 will be described.

Figure 6:
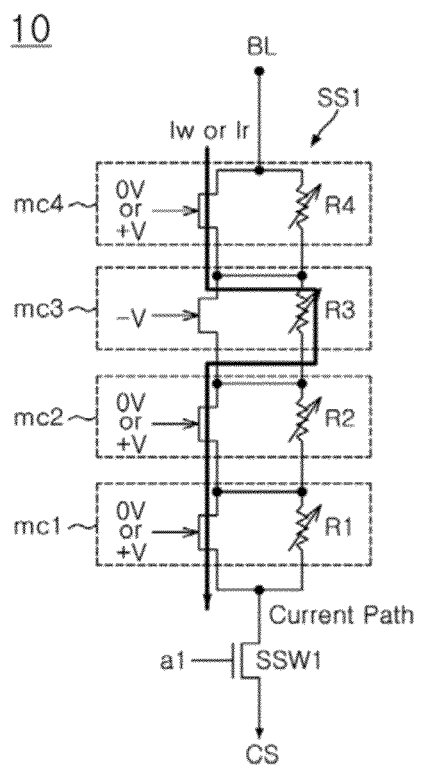
FIG. 6 is a circuit diagram illustrating a driving method of an exemplary variable resistance memory device.

Referring to FIG. 6, a high voltage is applied to a gate a1 of a first string switch SSW1 to select the first column string SS1.

To write data to the third memory cell mc3, in a state in which a junction FET of the third memory device mc3 is turned off (see FIG. 6), junction FETs of first, second, and fourth memory cells mc1, mc2, and, c4 are floating or turned on (see FIG. 4 or 5).

That is, 0 (zero) voltage or a positive voltage +V is applied to the first, second, and fourth junction FETs SW1, SW2, and SW4, and a negative voltage −V is applied to a gate of a third junction FET SW3.

Accordingly, the fourth, second, first junction FETs SW4, SW2, and SW1 in the fourth, second, and first memory cells mc4, mc2, and mc1 are turned on, and a current path is formed in the junction FETs SW4, SW2, and SWL. On the other hand, the third junction FET SW3 in the third memory cell mc3 is turned off, and a current path is formed in a third variable resistor R3.

Therefore, a write current Iw provided from the bit line BL flows to the common source line CS through the fourth junction FET SW4, the third variable resistor R3, and the second and first junction transistors SW2 and SW1. Therefore, data is written in the third variable resistor R3 during the process.

In the same state as in the above-described write operation, a read current Ir is provided from the bit line BL. The read current Ir reaches the common source line CS connected to a ground through a corresponding current path. The data written in the variable resistor R3 may be checked by measuring a current value reaching the common source line CS. At this time, the read current Ir has a level that does not affect a determination of a state of the variable resistor R3, and may have a lower value than the write current Iw.

FIGS. 7 to 11 are cross-sectional views illustrating a process of manufacturing an exemplary variable resistance memory device.

Figure 7:
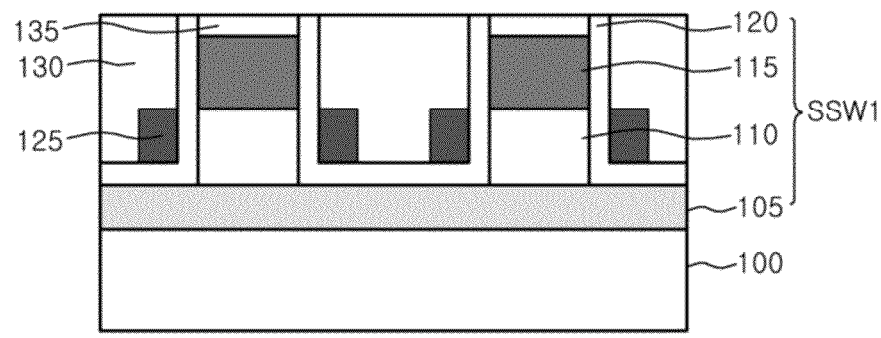
FIGS. 7 to 11 are cross-sectional views sequentially illustrating a method of manufacturing an exemplary variable resistance memory device.

Referring to FIG. 7, a common source region 105 is formed on a semiconductor substrate 100. The common source region 105 may include, for example, an impurity region or a conductive layer. A common source region 105 including an impurity region may be formed by implanting an impurity having a conductivity type opposite a conductivity type of the semiconductor substrate. For example, the common source region 105 may include an N-type impurity formed in a P-type semiconductor substrate 100. Alternatively, a common source region 105, including a conductive layer, may be formed by depositing a polysilicon layer on the semiconductor substrate 100.

A conductive layer may be formed on the common source region 105 and then patterned to form a pillar 110 for formation of a channel of a string selection switch. For example, the conductive layer for the pillar may include a semiconductor layer such as a polysilicon layer. A drain region 115 may be formed by implanting an impurity, having the same conductivity type as the impurity of the common source region 105, into an upper portion of the pillar 100. Therefore, a channel formation region is defined in the pillar 110. At this time, the pillar 110 may be formed in regions defined as the column strings SS1 and SS2.

A gate insulating layer 120 may be deposited on the semiconductor substrate 100 in which the pillar 110 is formed, and a gate 125 may be formed to surround the pillar 110. Therefore, the string selection switches SSW1 and SSW2 having a vertical structure are completed.

An interlayer insulating layer 130 may be formed to cover the semiconductor substrate 100 in which the string selection switches SSW1 and SSW2 are formed. The interlayer insulating layer 130 may be formed to have a thickness sufficient to bury the string selection switches SSW1 and SSW2. The Interlayer insulating layer 130 may be planarized to expose the drain region 115. An ohmic layer 135 may be formed in the exposed drain region 115 through a general process. In an exemplary implementation, a silicide layer may be used as the ohmic layer 135, for example.

Figure 8:
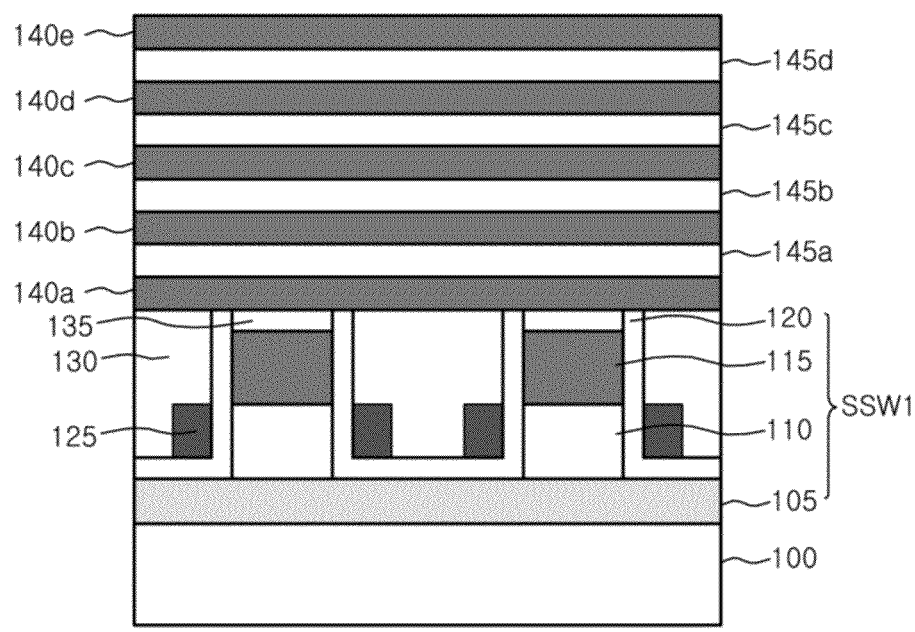

Referring to FIG. 8, insulating layers 140a, 140b, 140c, 140d, and 140e and conductive layers 145a, 145b, 145c, and 145d are alternately deposited on the interlayer insulating layer 130 to form a stacked gate structure. The insulating layer 140e may be located in the uppermost layer of the stacked gate structure. In an exemplary implementation, four conductive layers 145a, 145b, 145c, and 145d may be alternately stacked with the insulating layers 140a, 140b, 140c, and 140d, so that four memory cells are stacked. Therefore, a memory cell is a stack of a conductive layer and an insulating layer.

The conductive layers 145a, 145b, 145c, and 145d may be a material for a gate of the junction FET constituting the memory cell. For example, the material for the gate of the junction FET may include tungsten (W), copper (Cu), titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), or tantalum oxynitride (TaON). In an exemplary implementation, if the gate conductive layers 145a, 145b, 145c, and 145d include a metal material, then an ohmic contact layer may be formed in a contact portion with the channel layer to be formed later.

Figure 9:
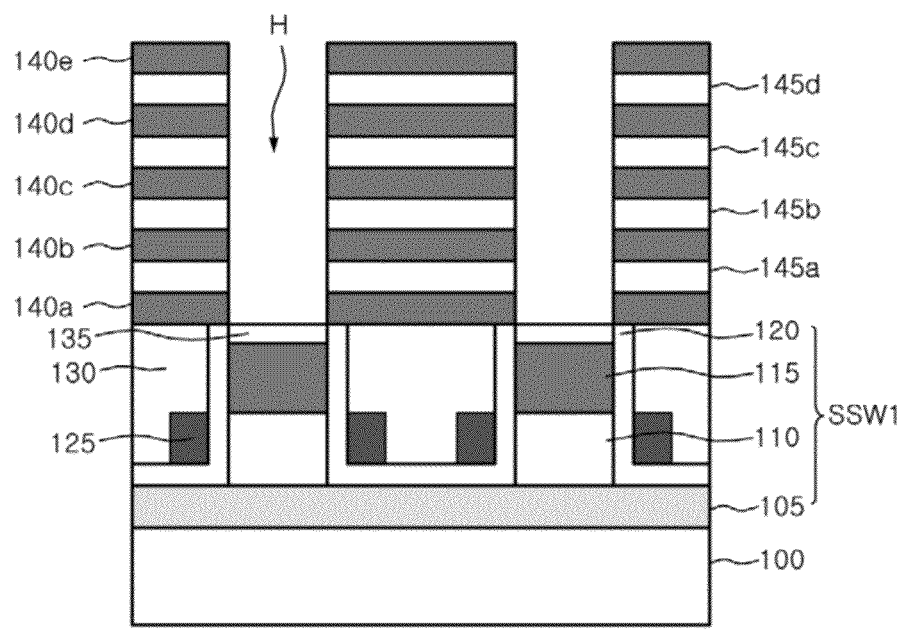

Referring to FIG. 9, the insulating layers 140a, 140b, 140c, 140d, and 140e and the conductive layers 145a, 145b, 145c, and 145d are etched to form a hole H exposing the ohmic layer 135 on the pillar 110.

Figure 10:
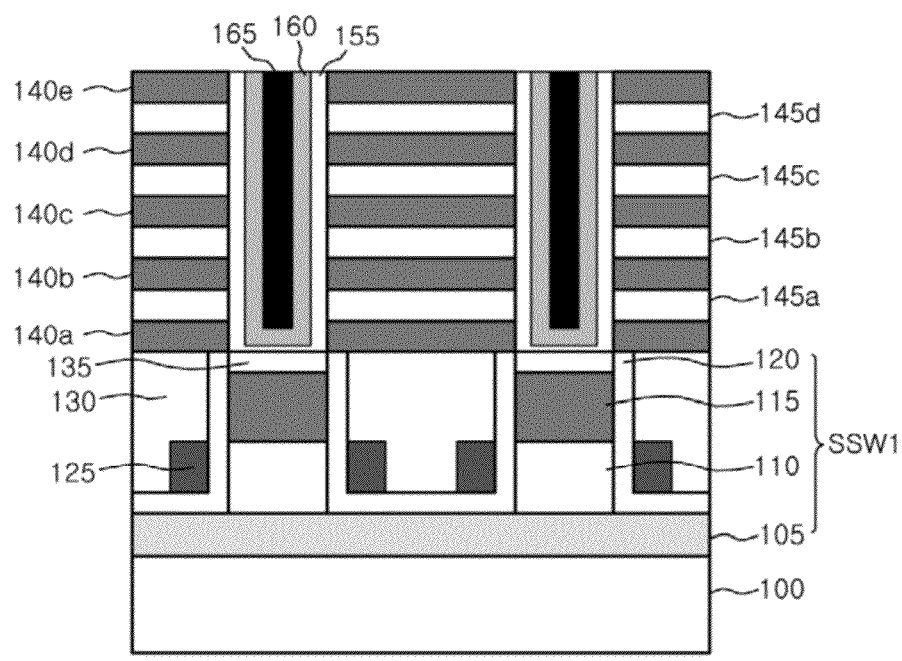

Referring to FIG. 10, a channel layer 155 of the junction FET and a variable resistance layer 160 are sequentially formed on along the inner surface of the hole H. The channel layer 155 and the variable resistance layer 160 may be conformally formed to a uniform thickness. Since the channel layer 155 is formed along the surface of the insulating layers 140a, 140b, 140c, 140d, and 140e and the conductive layers 145a, 145b, 145c, and 145d that define the hole H, the channel layer of the junction FET may be formed perpendicular to a surface of the substrate. In an exemplary implementation, the channel layer 155 may be an N-type semiconductor layer, such as a silicon (Si) layer, a silicon germanium (SiGe) layer, or a gallium arsenide (GaAs) layer. The variable resistance layer 160 may include various materials, such as a PCMO layer, which is a material for a ReRAM, a chalcogenide layer, which is a material for a PCRAM, a magnetic layer, which is a material for a MRAM, a magnetization reversal device layer, which is a material for a spin-transfer torque magnetoresistive RAM (STTMRAM), or a polymer layer, which is a material for a polymer RAM (PoRAM). A buried insulating layer 165 is formed in the hole H in which the channel layer 155 and the variable resistance layer 160 are formed. In an alternative exemplary implementation, the buried insulating layer 165 may be omitted by increasing the thickness of the variable resistance layer 160.

Figure 11:
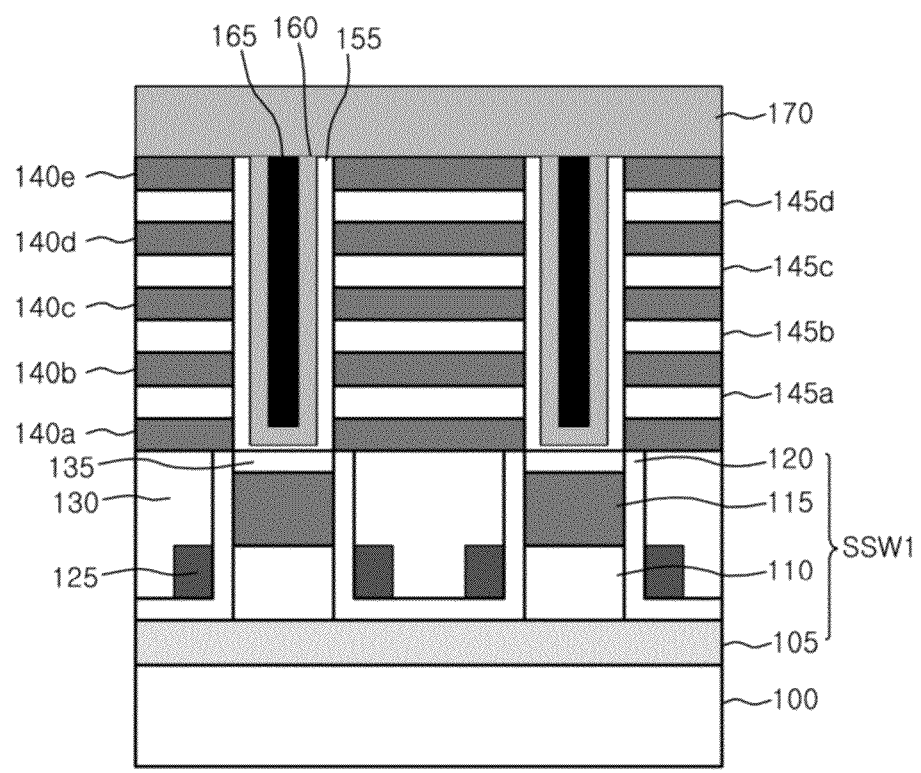

Referring to FIG. 11, a bit line 170 is formed, via a known method, on the insulating layers 140a, 140b, 140c, 140d, and 140e, the conductive layers 145a, 145b, 145c, and 145d, and the buried insulating layer 165. Before the forming of the bit line 170, additional insulating material may be formed in the conductive layers 145a, 145b, 145c, and 145d between the holes H, so that the bit line may be implemented in the same shape as the gate of the string selection switch.

The 3D variable resistance memory device may perform data read and write by forming a current path in a variable resistor of the selected memory cell through application of the reverse bias to the cell gate as described with reference to FIGS. 3 to 5. In an exemplary implementation, a plurality of memory cells are formed in a limited space in a stacking manner through the stacking of the cell gates, and thus integration density may be improved. Further, the junction FET with the simplified structure and good switching performance is used as a switching device and thus switching characteristics and structural stabilization may be obtained.

The above description is illustrative and not limitative. Various alternatives and equivalents are possible. The invention is not limited by the exemplary implementation described herein. Nor is the invention limited to any specific type of semiconductor device.

What is claimed is:

1. A method of driving a variable resistance memory device, in which a plurality of memory cells are stacked, and each of the plurality of memory cell includes a junction transistor and a variable resistor connected in parallel to the junction transistor, the method comprising:
   turning off a junction transistor of a selected one of the plurality of stacked memory cells; and
   turning on junction transistors of non-selected memory cells of the plurality of stacked memory cells to form a current path in a variable resistance layer of the selected memory cell.

* * * * *